(12) United States Patent
Hur et al.

(10) Patent No.: US 6,219,298 B1
(45) Date of Patent: Apr. 17, 2001

(54) HIGH-SPEED ADDRESS DECODERS AND RELATED ADDRESS DECODING METHODS

(75) Inventors: Nak-won Hur, Kyungki-do; Byung-sick Moon, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/487,965

(22) Filed: Jan. 18, 2000

(30) Foreign Application Priority Data

Jan. 20, 1999 (KR) .................................................. 99-1649

(51) Int. Cl.[7] ...................................................... G11C 8/00
(52) U.S. Cl. ......................................... 365/230.06; 365/193
(58) Field of Search ............................. 365/230.06, 193, 365/189.01, 230.01

(56) References Cited

U.S. PATENT DOCUMENTS 5,428,577 * 6/1995 Yumitori et al. ..................... 365/203
5,485,426 * 1/1996 Lee et al. ............................. 365/203
5,732,040 * 3/1998 Yabe ................................ 365/230.03

* cited by examiner

Primary Examiner—David Nelms
Assistant Examiner—Hoal V. Ho
(74) Attorney, Agent, or Firm—Myers Bigel Sibley & Sajovec

(57) ABSTRACT

High speed address decoders may include a predecoder and a main decoder that are both responsive to a control signal. The predecoder switches from an active state to an inactive state in response to a transition of the control signal from a first logic state to a second logic state. Conversely, the main decoder commences switching from an inactive state to an active state simultaneously with the transition of the control signal from the first logic state to the second logic state. The predecoder may generate a predecoded address signal while the control signal is in the first logic state, which may then be decoded by the main decoder to activate a line enable signal when the control signal transitions to the second logic state. As a result, address decoding speed may be improved thereby facilitating higher speed operation of an integrated circuit memory device.

16 Claims, 4 Drawing Sheets

HIGH-SPEED ADDRESS DECODERS AND RELATED ADDRESS DECODING METHODS

RELATED APPLICATION

This application claims the benefit of Korean Patent Application No. 99-1649, filed Jan. 20, 1999, the disclosure of which is hereby incorporated herein by reference.

FIELD OF THE INVENTION

The present invention relates generally to the field of integrated circuit memory devices and, more particularly, to high-speed address decoding in integrated circuit memory devices.

BACKGROUND OF THE INVENTION

Improvements in both speed and functionality of personal computers and multimedia systems have generally resulted in accompanying improvements in memory devices to support the operation of these products. Various methods have been developed to increase the operational speed of integrated circuit memory devices. One approach to increasing the operational speed of integrated circuit memory devices may involve increasing the transmission speed of signals on data paths, such as the write data path and the read data path, which are used to write data to a memory cell and read data stored in a memory cell, respectively. It may also be desirable to decode a memory cell address at high speed to allow high-speed selection of a memory cell. In this regard, it may be particularly advantageous to decode row addresses at high speed to allow high-speed selection of a row or a word line.

With reference to FIG. 1, a conventional integrated circuit memory device includes a row predecoder 11 and an internal master signal generator 13. The internal master signal generator 13 is coupled to both the row predecoder 11 and an enable signal generator 15. The integrated circuit memory device further includes a row main decoder 17, which is coupled to a memory cell array 19. The row predecoder 11 and the enable signal generator 15 are both coupled to the row main decoder 17. Operations of the integrated circuit memory device of FIG. 1 will be described hereafter with reference to the signal timing diagram of FIG. 2.

A row address RAi and a row address strobe signal $\overline{RAS}$ (ie., external master signal) are provided as inputs to the row predecoder 11 and the internal master signal generator 13, respectively. As shown in FIG. 2, the row address RAi is provided for a predetermined length of time, tAS (ie., row address setup time) before the row address strobe signal $\overline{RAS}$ is activated (ie., driven to a logic 0 level). The internal master signal generator 13, in response to the activation of the row address strobe signal $\overline{RAS}$, activates an internal master signal PR by driving the internal master signal PR to a logic 1 level. In response to the activation of the internal master signal PR, the row predecoder 11 predecodes the row address RAi and generates a predecoded row address DRAij.

After the internal master signal PR has been activated, the enable signal generator 15 allows a predetermined time interval tF to elapse before activating an enable signal PNBLS by driving the enable signal PNBLS to a logic 1 level. This delay provides the row predecoder 11 with time to generate the predecoded row address DRAij. The row main decoder 17 decodes the predecoded row address DRAij and activates a word line enable signal NWEi by driving the word line enable signal NWEi to a logic 1 level in response to the activation of the enable signal PNBLS.

When the word line enable signal NWEi is activated, a corresponding word line in the memory cell array 19 is activated. Accordingly, a corresponding memory cell is selected from the memory cell array 19.

As illustrated in the foregoing discussion, decoding a row address in a conventional integrated circuit memory device typically involves at least two time delays: First, the row predecoder 11 waits for the internal master signal generator 13 to activate the internal master signal PR before predecoding the row address RAi. Second, the enable signal generator 15 delays a predetermined time tF before activating the enable signal PNBLS to provide the row predecoder 11 with time to generate the predecoded row address DRAij. As a result, conventional integrated circuit memory devices may take a relatively long time from the point in time at which the row address $\overline{RAS}$ is activated to the point in time at which the word line enable signal NWEi is activated.

Consequently, there exists a need for improved (e.g., higher speed) address decoding in integrated circuit memory devices.

SUMMARY OF THE INVENTION

High-speed address decoders may include a predecoder and a main decoder that a re both responsive to a control signal. The predecoder switches from an active state to an inactive state in response to a transition of the control signal from a first logic state to a second logic state. Conversely, the main decoder commences switching from an inactive state to an active state simultaneously with the transition of the control signal from the first logic state to the second logic state. The predecoder may generate a predecoded address signal while the control signal is in the first logic state, which may then be decoded by the main decoder to activate a line enable signal when the control signal transitions to the second logic state. As a result, address decoding speed may be improved thereby facilitating higher speed operation of an integrated circuit memory device.

In accordance with an aspect of the present invention, integrated circuit memory devices may include a predecoder and a main decoder as discussed in the foregoing. Integrated circuit memory devices may further include an internal signal generator that generates the control signal as an internal master signal in response to an address strobe signal and a memory cell array that is responsive to a line enable signal that is output from the main decoder. Because the predecoded address signal is already available when the control signal (ie., internal master signal) transitions from the first logic state to the second logic state, the main decoder can activate the line enable signal immediately upon the control signal transition.

In accordance with yet another aspect of the invention, the predecoder preferably comprises a plurality of logic gates that receive predetermined bits of the address signal at input terminals thereof, a plurality of latches that generate the predecoded address signal at output terminals thereof, and a plurality of transmission gates that are responsive to the control signal and connect the output terminals of the logic gates to the input terminals of the latches during the first logic state of the control signal.

In accordance with still another aspect of the invention, the main decoder preferably comprises a latch, a PMOS precharge transistor connected between a first reference potential (i.e., a logic 1 reference potential) and an input terminal of the latch, and a plurality of NMOS transistors electrically connected in series between the input terminal of the latch and a second reference potential (i.e., a logic 0 reference potential). The gate terminals of the NMOS transistors receive predetermined bits of the predecoded address signal from the predecoder. A control signal may be applied to the gate of the PMOS precharge transistor to charge the input terminal of the latch to a logic 1 level.

In accordance with still another aspect of the invention, both row and column addresses may be decoded. That is, the address may be either a row address or a column address and the line enable signal may be either a word line enable signal or a bit line enable signal.

Related address decoding methods are also disclosed herein.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
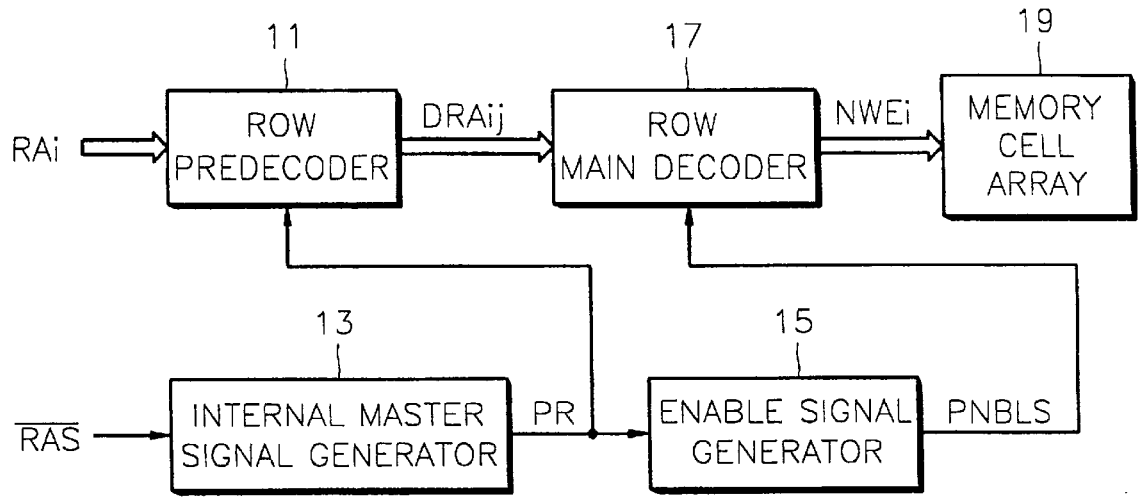
FIG. 1 is a block diagram that illustrates a conventional integrated circuit memory device.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

For purposes of clarity and in no way limited thereto, the present invention is described hereafter in the context of decoding a row address for a memory cell array. It should be understood that the principles of the present invention are equally applicable to decoding a column address for a memory cell array.

Figure 3:
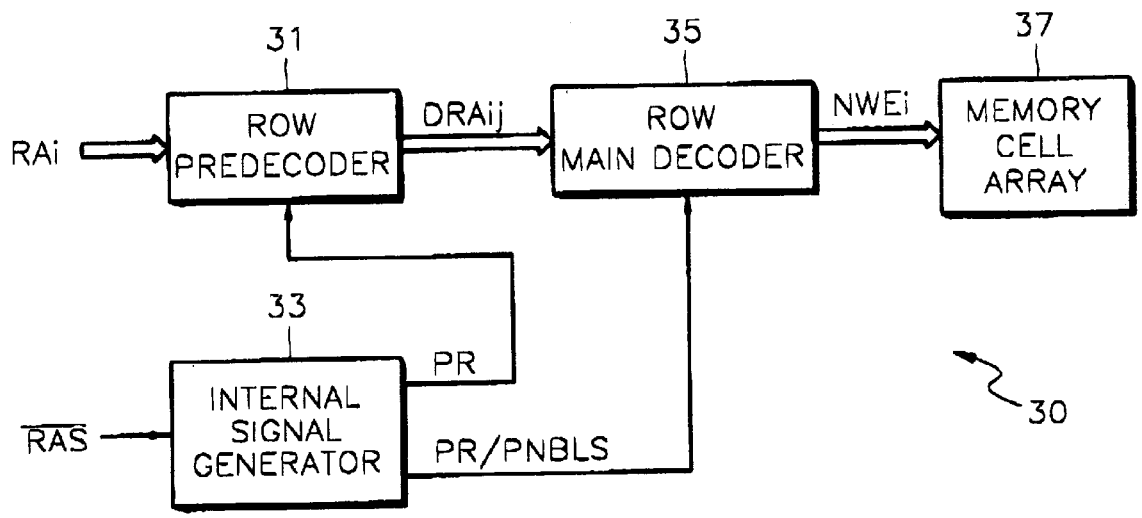
FIG. 3 is a block diagram that illustrates integrated circuit memory devices and address signal decoding methods in accordance with the present invention.

Referring now to FIG. 3, an integrated circuit memory device 30, in accordance with the present invention, preferably includes a row predecoder 31 that is coupled to a row main decoder 35. The row main decoder 35 is coupled to a memory cell array 37. The integrated circuit memory device further includes an internal signal generator 33, which is coupled to both the row predecoder 31 and the row main decoder 35. Exemplary operations of the integrated circuit memory device 30 will be described hereafter with reference to the signal timing diagram of FIG. 7.

Figure 7:
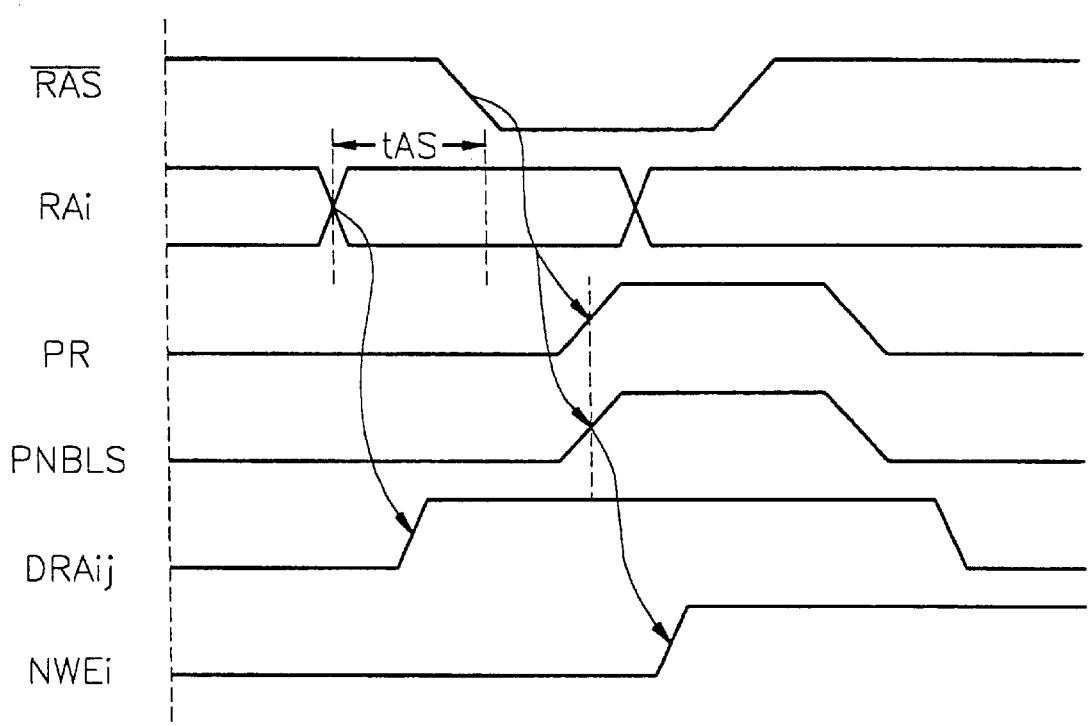
FIG. 7 is a timing diagram that illustrates operations of integrated circuit memory devices and address signal decoding methods of FIG. 3 in accordance with the present invention.

A row address RAi and a row address strobe signal $\overline{RAS}$ (i.e., external master signal) are provided as inputs to the row predecoder 31 and the internal signal generator 33, respectively. Typically, the row address strobe signal $\overline{RAS}$ is generated external to the row predecoder 31, internal signal generator 33, row main decoder 35, and memory cell array 37. The row address RAi may be externally or internally generated. As shown in FIG. 7, it is customary for the row address RAi to be provided for a predetermined length of time, tAS (i.e., row address setup time) before the row address strobe signal $\overline{RAS}$ is activated (ie., driven to a logic 0 level). The internal signal generator 33, in response to the activation of the row address strobe signal $\overline{RAS}$, activates an internal master signal PR and, optionally, an enable signal PNBLS by driving both the internal master signal PR and the enable signal PNBLS to a logic 1 level. The row predecoder 31, however, predecodes the row address RAi during the inactive state (ie., logic 1 level) of both the row address strobe signal $\overline{RAS}$ and the internal master signal PR to generate the predecoded row address DRAij.

The row main decoder 35 decodes the predecoded row address DRAij and activates a word line enable signal NWEi by driving the word line enable signal NWEi to a logic 1 level in response to the activation of the enable signal PNBLS. Note, however, that the enable signal PNBLS can be eliminated and replaced with the internal master signal PR without changing any finctionality of the integrated circuit memory device 30 because the enable signal PNBLS and the internal master signal PR may be identical signals. When the word line enable signal NWEi is activated, a corresponding word line in the memory cell array 37 is activated. Accordingly, a corresponding memory cell is selected from the memory cell array 37.

Figure 2:
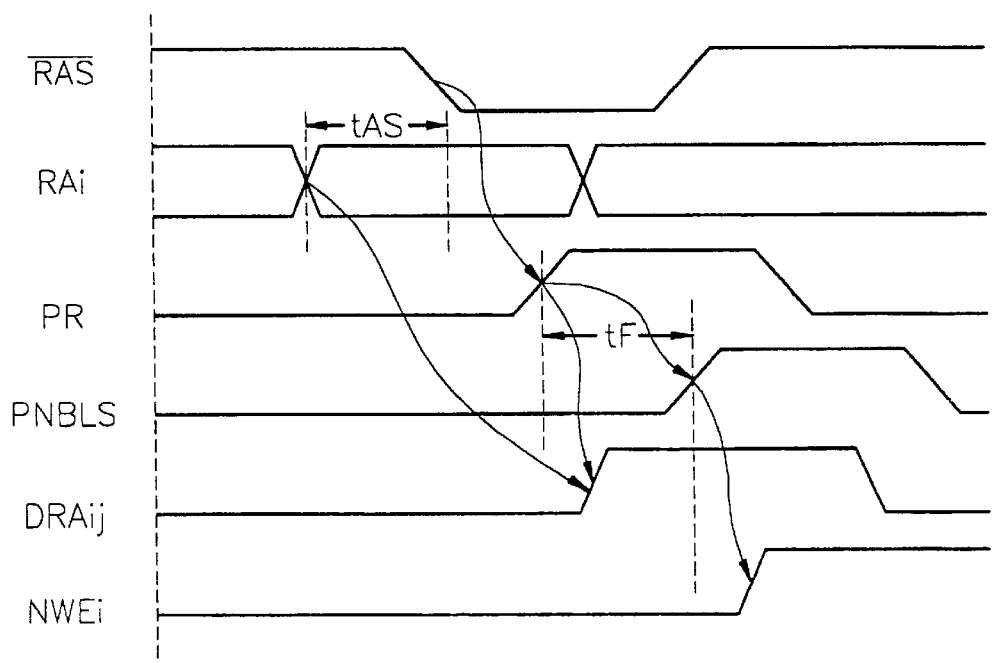
FIG. 2 is a timing diagram that illustrates operations of the integrated circuit memory device of FIG. 1.

Advantageously, the integrated circuit memory device 30 in accordance with the present invention may reduce the time between activation of the row address strobe signal $\overline{RAS}$ and activation of the word line enable signal NWEi. Specifically, the row predecoder 31 predecodes the row address RAi during the inactive state of both the row address strobe signal $\overline{RAS}$ and the internal master signal PR. In contrast with conventional integrated circuit memory devices, the row predecoder 31 need not wait for the internal signal generator 33 to activate the internal master signal PR before predecoding the row address RAi. Moreover, because the predecoded row address DRAij is already available when the row address strobe signal $\overline{RAS}$ is activated, the row main decoder 35 can activate the word line enable signal NWEi immediately upon activation of the internal master signal PR and, optionally, the enable signal PNBLS. As discussed hereinabove with respect to FIGS. 1 and 2, conventional integrated circuit memory devices may delay activation of the enable signal PNBLS with respect to activation of the internal master signal PR by a predetermined time tF to provide the row predecoder 11 with time to generate the predecoded row address DRAij. Accordingly, address decoding speed may be improved thereby facilitating higher speed operation of the integrated circuit memory device.

As will be appreciated by those skilled in the art, the foregoing principles and concepts may also be applied to decoding a column address. For example, the row address RAi may be a column address, the row predecoder 31 may be a column predecoder, the row main decoder 35 may be a column main decoder, and the word line enable signal NWEi may be a bit line enable signal.

Figure 4:
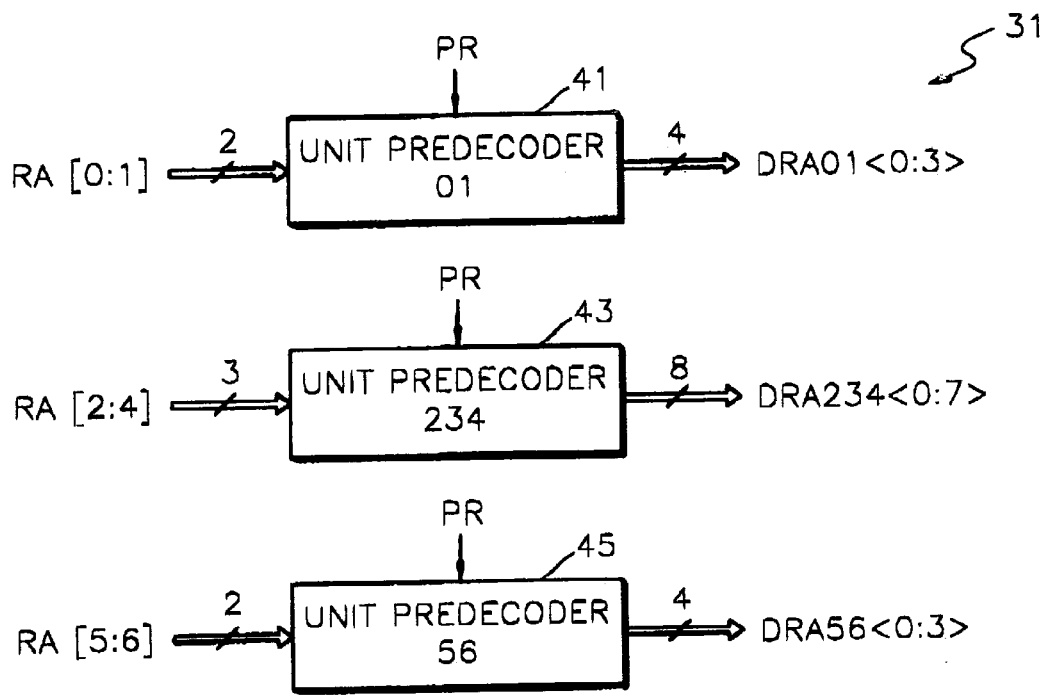
FIG. 4 is a block diagram that illustrates a row predecoder shown in FIG. 3 in greater detail.

Referring now to FIG. 4, the row predecoder 31 is illustrated in greater detail. The row predecoder 31 preferably comprises one or more unit predecoders 41, 43, and 45, which predecode row address bits RA[0:1], RA[2:4], and RA[5:6], respectively. The unit predecoders 41, 43, and 45 latch the predecoded row address signals DRA01<0:3>, DRA234<0:7>, and DRA56<0:3>, respectively, during the deactivated state of both the row address strobe signal $\overline{RAS}$ (logic 1 level) and the internal master signal PR (logic 0 level). Three unit predecoders 41, 43, and 45 are shown in FIG. 4 because seven bits are used for the row address RAi. In this example, the number of unit predecoders may range from one to three.

Figure 5:
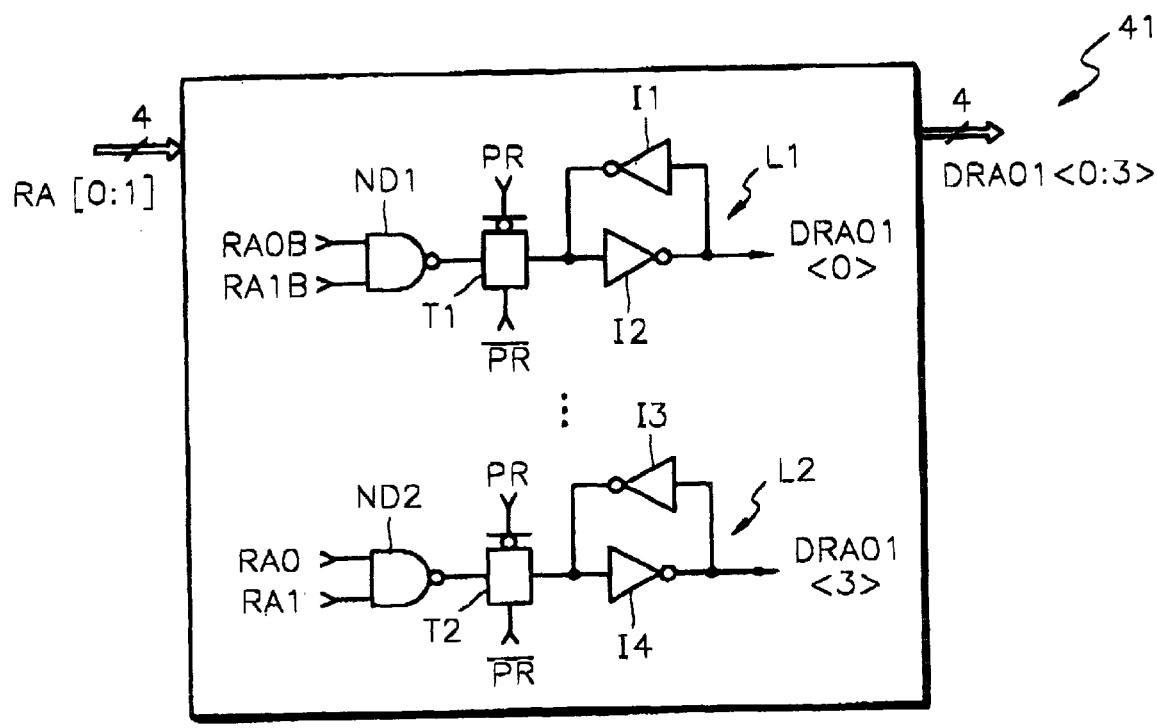
FIG. 5 is a circuit diagram that illustrates a predecoder shown in FIG. 4 in greater detail.

A preferred embodiment of the unit predecoder 41 is shown in FIG. 5. The remaining unit predecoders 43 and 45 may be embodied in like fashion. Note, however, that the unit predecoder 43 receives three row address bits RA[2:4] instead of two row address bits like the unit predecoders 41 and 45 and generates an eight bit predecoded row address signal DRA234<0:7>. The unit predecoder 41 includes a plurality of NAND gates (ND1 and ND2), transmission gates (T1 and T2), and latches (L1 and L2). NAND gate ND1 receives supplementary bits RA0B and RA1D as inputs, where RAiB corresponds to the complement of RAi. The transmission gate T1 transmits the output of the NAND gate ND1 during the deactivated state of both the row address strobe signal $\overline{RAS}$ (logic 1 level) and the internal master signal PR (logic 0 level). The latch L1 latches the output of the transmission gate T1 and outputs the predecoded row address bit DRA01<0>.

NAND gate ND2 receives row address bits RAO and RAI as inputs. The transmission gate T2 transmits the output of the NAND gate ND2 during the deactivated state of both the row address strobe signal $\overline{RAS}$ (logic 1 level) and the internal master signal PR (logic 0 level). The latch L2 latches the output of the transmission gate T2 and outputs the predecoded row address bit DRA01<3>.

In other words, the unit predecoder 41 predecodes row address bits RA[0:1] during the deactivated state of both the row address strobe signal $\overline{RAS}$ (logic 1 level) and the internal master signal PR (logic 0 level) and latches the corresponding predecoded row address bits DRA01<0:3>.

As illustrated in FIGS. 3, 4, and 7, the row predecoder 31 is active while the internal master signal PR is in a logic 0 state. That is, the transmission gates T1, T2, . . . Ti allow a predecoded row address DRAij to propagate through to the latches L1, L2, . . . Li. When the internal master signal PR transitions from the logic 0 state to the logic 1 state, however, the row predecoder 31 switches from an active state to an inactive state. That is, the transmission gates Ti, T2, . . . Ti prevent a predecoded row address DRAij from propagating through to the latches L1, L2, . . . .Li.

Figure 6:
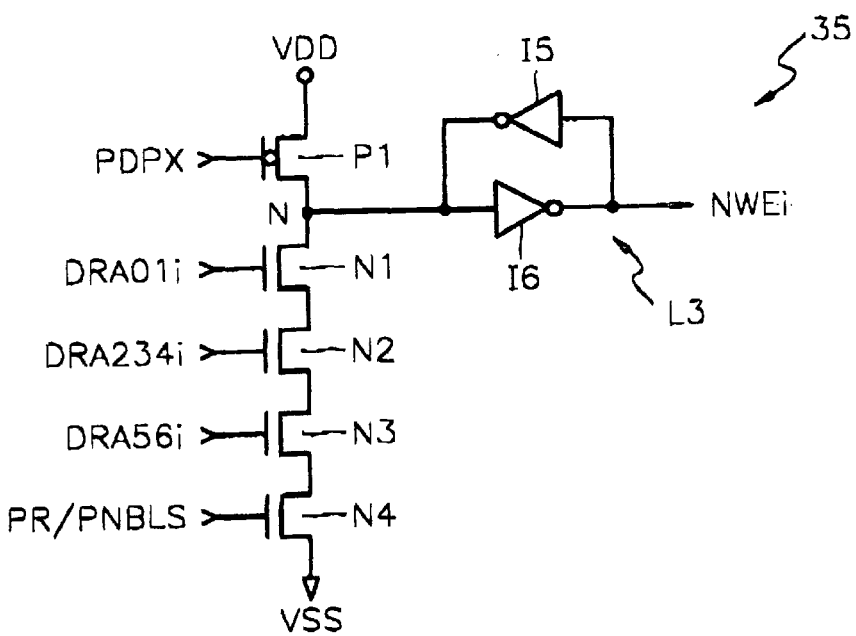
FIG. 6 is a circuit diagram that illustrates a row main decoder shown in FIG. 3 in greater detail.

A preferred embodiment of the row main decoder 35 is shown in FIG. 6. The row main decoder 35 includes a PMOS precharge transistor P1 electrically connected between a reference potential VDD and the input terminal of a latch L3 at node N. The transistor P1 may precharge node N to the reference potential VDD in response to a control signal PDPX applied to its gate terminal. The row main decoder 35 further includes a plurality of NMOS transistors N1, N2, N3, and N4 connected in series between the node N and a ground reference potential VSS. The latch L3 comprises two inverters I5 and I6 configured as shown, which latch the inverse of the voltage level at node N for output as the word line enable signal NWEi.

The predecoded row address bits DRAij are applied to the gates of the NMOS transistors N1 through N4 as follows: DRA01<i>, i=0 through 3 are applied to the gate of the NMOS transistor N1; DRA234<i>, i=0 through 7 are applied to the gate of the NMOS transistor N2; and DRA56<i>, i=0 through 3 are applied to the gate of the NMOS transistor N3. The internal master signal PR or, optionally, the enable signal PNBLS is applied to the gate of the NMOS transistor N4.

Operations of the row main decoder 35 will now be described. When the enable signal PNBLS is activated to a logic 1 level and the predecoded row addresses DRA01<i>, DRA234<i>, and DRA56<i>are activated to a logic 1 level by the row predecoder 31, the NMOS transistors N1 through N4 are turned on and the node N is pulled to the reference potential VSS, which corresponds to a logic 0 level. As a result, the output of the latch L3, which is the word line enable signal NWEi, is activated to a logic 1 level.

As illustrated in FIGS. 3, 6, and 7, the row main decoder 31 is inactive while the internal master signal PR is in a logic 0 state. That is, the NMOS transistor N4 is turned off and prevents the latch L3 from activating the word line enable signal NWEi. When the internal master signal PR transitions from the logic 0 state to the logic 1 state, however, the row predecoder 31 switches from an inactive state to an active state. That is, the NMOS transistor N4 is turned on, which allows the latch L3 to activate the word line enable signal based on the predecoded row address bits DRAij applied to the NMOS transistors N1, N2, and N3.

Thus, opposite states of the internal master signal PR trigger the row predecoder 31 and the row main decoder 35, which may prevent a new predecoded row address DRAij from being input to the row main decoder 35 before a previous predecoded row address DRAij has been decoded.

The principles of the present invention have been described herein in connection with row address decoding in an integrated circuit memory device. From the foregoing it can readily be seen that the present invention may allow predecoding of the row address RAi during the inactive state of both the row address strobe signal $\overline{RAS}$ and the internal master signal PR. Because the predecoded row address DRAij is already available when the row address strobe signal $\overline{RAS}$ is activated, the row main decoder 35 can activate the word line enable signal NWEi immediately upon activation of the internal master signal PR and, optionally, the enable signal PNBLS. Accordingly, address decoding speed may be improved thereby facilitating higher speed operation of the integrated circuit memory device.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An address decoder, comprising:
   a predecoder that is responsive to a first control signal and an address and that switches from an active state to an inactive state in response to a transition of the first control signal from a first logic state to a second logic state; and
   a main decoder that is responsive to the first control signal and an output of the predecoder and that commences switching from an inactive state to an active state simultaneously with the transition.

2. The address decoder of claim 1, wherein the transition is a rising edge of the first control signal.

3. The address decoder of claim 1, wherein the transition is a leading edge of the first control signal.

4. The address decoder of claim 1, wherein the predecoder comprises:
  a plurality of logic gates that receive predetermined bits of the address at input terminals thereof;
  a plurality of latches that generate a predecoded address at output terminals thereof; and
  a plurality of transmission gates that are responsive to the first control signal and that respectively connect output terminals of the plurality of logic gates to input terminals of the plurality of latches during the first logic state of the control signal.

5. The address decoder of claim 1, wherein the main decoder comprises:
  a latch that has an input terminal and generates a line enable signal at an output terminal thereof;
  a PMOS precharge transistor electrically connected between a first reference potential and the input terminal and that receives a second control signal at a gate terminal thereof; and
  a plurality of NMOS transistors electrically connected in series between the input terminal and a second reference potential and that receive the first control signal and predetermined bits of the predecoded address at respective gate terminals thereof.

6. An integrated circuit memory device, comprising:
  a predecoder that is responsive to an internal master signal and an address and that switches from an active state to an inactive state in response to a transition of the internal master signal from a first logic state to a second logic state;
  an internal signal generator that generates the internal master signal in response to an address strobe signal;
  a main decoder that is responsive to the internal master signal and a predecoded address output from the predecoder and that commences switching from an inactive state to an active state simultaneously with the transition; and
  a memory cell array that is responsive to a line enable signal output from the main decoder.

7. The integrated circuit memory device as recited in claim 6, wherein the address is a row address and the line enable signal is a word line enable signal.

8. The integrated circuit memory device as recited in claim 6, wherein the address is a column address and the line enable signal is a bit line enable signal.

9. The integrated circuit memory device as recited in claim 6, wherein the address strobe signal is generated external to the predecoder, the internal signal generator, the main decoder, and the memory cell array.

10. An integrated circuit memory device, comprising:
  a predecoder that is responsive to an internal master signal and an address and that switches from an active state to an inactive state in response to a transition of the internal master signal from a first logic state to a second logic state;
  an internal signal generator that generates the internal master signal and an enable signal in response to an address strobe signal;
  a main decoder that is responsive to the enable signal and a predecoded address output from the predecoder and that commences switching from an inactive state to an active state in response to a transition of the enable signal from a first logic state to a second logic state, the transition of the enable signal commencing during the transition of the internal master signal; and
  a memory cell array that is responsive to a line enable signal output from the main decoder.

11. The integrated circuit memory device as recited in claim 10, wherein the address is a row address and the line enable signal is a word line enable signal.

12. The integrated circuit memory device as recited in claim 10, wherein the address is a column address and the line enable signal is a bit line enable signal.

13. The integrated circuit memory device as recited in claim 10, wherein the address strobe signal is generated external to the predecoder, the internal signal generator, the main decoder, and the memory cell array.

14. A method of decoding an address, comprising the steps of:
  predecoding an address in a predecoder during a first logic state of a control signal;
  switching the predecoder from an active state to an inactive state in response to a transition of the control signal from the first logic state to a second logic state;
  switching a main decoder from an inactive state to an active state simultaneously with the transition; and
  decoding the predecoded address in the main decoder.

15. The method as recited in claim 14, wherein the address is a row address.

16. The method as recited in claim 14, wherein the address is a column address.

* * * * *